United States Patent [19]

Long

[11] Patent Number: 5,081,655
[45] Date of Patent: Jan. 14, 1992

[54] DIGITAL PHASE ALIGNER AND METHOD FOR ITS OPERATION

[75] Inventor: John R. Long, Ottawa, Canada

[73] Assignee: Northern Telecom Limited, Montreal, Canada

[21] Appl. No.: 447,326

[22] Filed: Dec. 7, 1989

[30] Foreign Application Priority Data

Oct. 23, 1989 [CA] Canada ................................. 2001266

[51] Int. Cl.⁵ .............................................. H03D 3/24
[52] U.S. Cl. ................................. 375/119; 331/1 A; 307/511
[58] Field of Search ............... 375/111, 113, 118, 119, 375/120; 358/158; 328/55, 63, 72; 307/231, 510, 511; 371/1; 331/1 R, 1 A, 25, 18; 360/37.1

[56] References Cited

U.S. PATENT DOCUMENTS

| | | | |
|---|---|---|---|
| 4,119,796 | 10/1978 | Jones | 375/118 |
| 4,151,485 | 4/1979 | La Fratta | 375/120 |
| 4,604,582 | 8/1986 | Strenkowski et al. | 328/55 |
| 4,611,230 | 9/1986 | Nienaber | 375/120 |
| 4,617,679 | 10/1986 | Brooks | 375/119 |
| 4,623,805 | 11/1986 | Flora et al. | 307/602 |
| 4,637,018 | 1/1987 | Flora et al. | 371/1 |
| 4,755,704 | 7/1988 | Flora et al. | 328/55 |
| 4,756,011 | 7/1988 | Cordell | 375/118 |
| 4,773,085 | 9/1988 | Cordell | 375/120 |
| 4,821,296 | 4/1989 | Cordell | 375/119 |
| 4,821,297 | 4/1989 | Bergmann et al. | 375/120 |
| 4,831,338 | 5/1989 | Yamaguchi | 375/120 |
| 4,837,781 | 6/1989 | Hickling | 375/120 |
| 4,839,907 | 6/1989 | Saneski | 375/113 |

OTHER PUBLICATIONS

"A 45-Mbit/s CMOS VLSI Digital Phase Aligner", Robert R. Cordell, IEEE Journal of Solid-State Circuits, vol. 23, No. 2, Apr. 1988.

Primary Examiner—Stephen Chin
Attorney, Agent, or Firm—C. W. Junkin

[57] ABSTRACT

In methods and apparatus for aligning the phase of a local clock signal with the phase of a data signal, an incoming data signal is delayed to provide a delayed data signal and regenerated with a local clock signal to provide a regenerated data signal. A difference between the phase of the delayed data signal and the phase of the regenerated data signal is detected. The phase of the local clock signal is retarded by a predetermined fraction of a bit period if the regenerated data signal leads the delayed data signal and is advanced by the predetermined fraction of the bit period if the regenerated data signal lags the delayed data signal. The retiming, detecting, retarding and advancing steps are repeated continuously to obtain and maintain approximate alignment of the phase of the local clock signal with the phase of the delayed data signal. The methods and apparatus are useful in high speed packet switches.

6 Claims, 4 Drawing Sheets

DIGITAL PHASE ALIGNER AND METHOD FOR ITS OPERATION

FIELD OF THE INVENTION

This invention relates to methods and apparatus for aligning the phase of a local clock signal with the phase of a data signal.

BACKGROUND OF THE INVENTION

Long distance data transmission systems use timing recovery techniques to derive a timing or clock waveform from a received data signal. Such techniques are not required for low data rate transmission within a localized system where the transmit and receive clock signals can be derived from a common clock source because the clock frequency and phase required for accurate interpretation of the received data is known. However, in high data rate applications, small differences in path length can lead to significant misalignments in phase.

For example, in high speed space switches used for switching packetized data, the path length between any given input and any given output depends on the connection configuration, and the connection configuration varies from switching event to switching event according to the switching paths that happen to be available at the time that the switching event occurs. Consequently, a serial ensemble of data packets arrives at a receive terminal with a known frequency but an unknown phase. Equipment connected to the receive terminal requires a local clock signal having both the correct frequency and the correct phase in order to demultiplex and process the received data properly.

Thus, a fast, reliable method and apparatus for aligning the phase of the local clock signal with the phase of the received data signal is required. The method and apparatus should require a very short time interval to achieve phase alignment since data cannot be reliably transmitted during the phase alignment interval and this limits the usable information capacity of the channel. The phase alignment should be accurate enough, and the jitter of the aligned clock signal should be small enough to ensure an acceptably low error rate. The apparatus should be monolithically integrable for cost reduction, should have a low sensitivity to component changes to ensure reproducibility in volume production, should require minimal trimming of components to minimize production labour content, and should operate properly over a wide frequency range for adaptability to a wide range of system designs.

Known methods for providing a clock signal which is phase-aligned with a received data signal include transmitting a clock signal with the data signal. This method is expensive because of the additional transmission channel which is required. The received data signal can be filtered to recover the clock signal, but this method requires a relatively long time interval to achieve phase alignment. Moreover, for some commonly used data coding schemes, such as non-return to zero (NRZ) coding, the data must be preprocessed before the clock signal can be recovered by filtering. Phase alignment methods which employ an analog Phase Locked Loop (PLL) to phase-align a local clock signal with a received data signal also require a relatively long time interval to achieve phase alignment. A self-timing monostable multivibrator can be used to generate a phase-aligned clock signal, but such multivibrators require individual circuit trimming and are sensitive to temperature and component variations.

In U.S. Pat. Nos. 4,773,085, 4,756,011 and 4,821,296, and in IEEE Journal of Solid State Circuits, Vol. 23, No. 2, p. 323-328, Robert R. Cordell discloses methods and apparatus for aligning the phase of a local clock signal with a received data signal in which the received data signal is oversampled to detect data transitions, and the samples are processed to determine an optimal local clock phase. In U.S. Pat. No. 4,839,907, Steven P. Saneski discloses a method and apparatus in which the received data signal is delayed, the delayed data signal is compared to the received data signal at prescribed transitions of a local clock signal, and one of the received data signal and the delayed data signal is processed according to the results of the comparisons. These methods and apparatus are complex and difficult to implement in high data rate systems.

In U.S. Pat. Nos. 4,623,805 and 4,637,018, Laurence P. Flora et al disclose a method and apparatus for fixing the phase of local clock signals with respect to a master clock signal. The method and apparatus employs feedback circuitry including a tapped delay line which provides a series of local clock signals having a progression of phases, an accurate constant delay for delaying the master clock signal by a predetermined desired amount, a phase comparator for comparing the delayed master clock with a selected one of the local clock signals, and a multiplexer for selecting one of the series of local clock signals according to the results of the phase comparison Unfortunately, this method and apparatus requires that the desired delay of the local clock be predetermined and constant. Consequently, this method and apparatus is not practical for use in high data rate packet switching applications in which the local clock phase may require adjustment for each individual data packet.

SUMMARY OF THE INVENTION

It is an object of this invention to provide methods and apparatus for aligning the phase of a local clock signal with the phase of a data signal.

It is a further object of this invention to provide such methods and apparatus which obviate or mitigate the problems of the methods and apparatus described above.

One aspect of the invention provides a method for aligning the phase of a local clock signal with the phase of a data signal. The method comprises: delaying an incoming data signal to provide a delayed data signal; regenerating the incoming data signal with a local clock signal to provide a regenerated data signal; detecting a difference between the phase of the delayed data signal and the phase of the regenerated data signal; retarding the phase of the local clock signal by a predetermined fraction of a bit period if the regenerated data signal leads the delayed data signal; advancing the phase of the local clock signal by the predetermined fraction of a bit period if the regenerated data signal lags the delayed data signal; and continuously repeating the above retiming, detecting, retarding and advancing steps to obtain and maintain approximate alignment of the phase of the local clock signal with the phase of the delayed data signal.

In this method, a series of clock signals may be provided with phases which are uniformly spaced by the predetermined fraction of a bit period, and the local clock signal may be provided by selecting one of the clock signals of the series of clock signals. In this case, the local clock signal may be retarded and advanced by the predetermined fraction of a bit period by selecting from the series of clock signals a clock signal which is adjacent to the previously selected clock signal in the series of clock signals.

The series of clock signals may be provided by connecting a clock signal to a tapped delay means having plural outputs connected to a multiplexer and selecting the local clock signal from the series of clock signals by operation of the multiplexer.

The difference between the phase of the delayed data signal and the phase of the regenerated data signal may be detected with a phase detector which provides a first output condition if the phase of the regenerated data signal leads the phase of the delayed data signal and a second output condition if the phase of the regenerated data signal lags the phase of the delayed data signal. Selection inputs of the multiplexer may be driven by a counter which is responsive to the first output condition to increase the count and responsive to the second output condition to decrease the count. The phase detection and selection operations may be enabled only on predetermined transitions of the delayed data signal to avoid race conditions at very high data rates.

The local clock signal may be inverted and the delayed data signal may be retimed with the inverted clock to provide a retimed data signal which is optimally phased with respect to the selected local clock signal for demultiplexing or other downstream processing. Alternatively, the inverted local clock signal may be used to both retime and demultiplex the delayed data signal.

Another aspect of the invention provides apparatus for aligning the phase of a local clock signal with the phase of a data signal. The apparatus comprises: delay means for delaying an incoming data signal to provide a delayed data signal; local clock signal generating means for generating a local clock signal; regenerating means responsive to the local clock signal to regenerate the incoming data signal; phase detection means responsive to the delayed data signal and the regenerated data signal to provide an output condition indicative of a difference between the phase of the delayed data signal and the phase of the regenerated data signal; and retarding and advancing means responsive to the output condition of the phase detection means and operably connected to the local clock generating means to retard the phase of the local clock by a predetermined fraction of a bit period if the regenerated data signal leads the delayed data signal and to advance the phase of the local clock by the predetermined fraction of a bit period if the regenerated data signal lags the delayed data signal.

The local clock signal generating means may comprise tapped delay means fed by a clock signal and a multiplexer fed by plural outputs of the tapped delay means. The multiplexer may be responsive to the advancing and retarding means to select a clock signal from one of the plural outputs of the tapped delay means.

The advancing and retarding means may comprise a counter which is responsive to one output condition of the phase detection means to increase the count and responsive to another output condition of the phase detection means to decrease the count.

The apparatus may further comprise control means for enabling phase detection and advancing and retarding of the local clock signal only on predetermined transitions of the delayed data signal.

Conveniently, the tapped delay means may have outputs providing eight or sixteen output signals, adjacent outputs providing signals having a phase difference of approximately one eighth or one sixteenth of a bit period respectively.

The apparatus may further comprise means for inverting the local clock signal and for retiming the delayed data signal with the inverted clock signal to provide a retimed data signal. Alternatively, the apparatus may further comprise means for retiming and demultiplexing the delayed data signal to provide retimed and demultiplexed data signals.

BRIEF DESCRIPTION OF THE DRAWINGS

An embodiment of the invention is described below by way of example only with reference to accompanying drawings, in which.

DETAILED DESCRIPTION OF EMBODIMENTS

Figure 1:
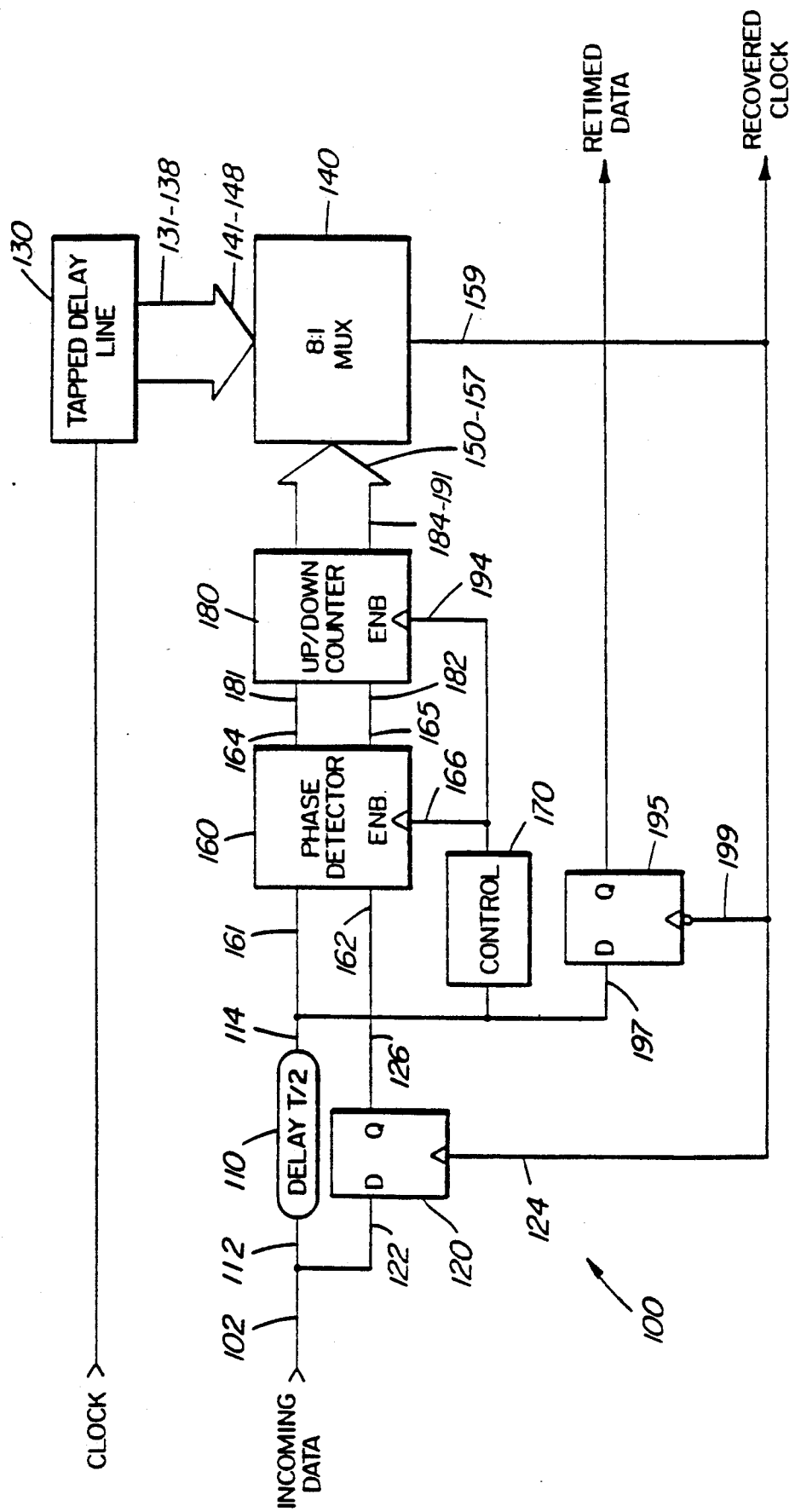
FIG. 1 is a block diagram of apparatus according to a first embodiment of the invention.

FIG. 1 is a block diagram of apparatus 100 according to a first embodiment of the invention.

The apparatus 100 comprises an incoming data terminal 102 to which an incoming data signal is applied, and delay means 110 having an input terminal 112 connected to the incoming data terminal 102. The delay means 110 delays the incoming data signal by approximately one half bit period to provide a delayed data signal.

Figure 2:
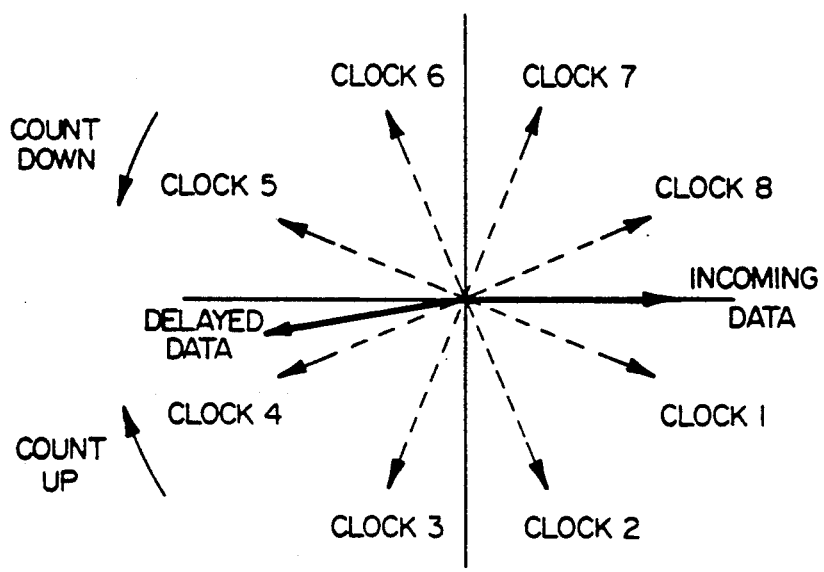
FIG. 2 is a phasor diagram showing the phase of signals at selected nodes of the apparatus of FIG. 1.

The apparatus 100 further comprises regenerating means in the form of a D-type flip flop 120 which has a D-input 122 connected to the incoming data terminal 102. The flip flop 120 is clocked by a local clock signal supplied by a local clock signal generating means comprising tapped delay means in the form of a tapped delay line 130 to which a clock signal is applied and a multiplexer 140. The delay line 130 has eight equally spaced output taps 131-138 which provide eight delayed clock signals. Adjacent taps 131-138 provide delayed clock signals having a phase difference of approximately one eighth of a bit period. The phase relationship of the delayed clock signals is illustrated in a phasor diagram in FIG. 2. Each of the taps 131-138 is connected to an input terminal 141-148 of the multiplexer 140, and the multiplexer 140 is responsive to a code applied to select terminals 150-157 of the multiplexer 140 to select one of the delayed clock signals for application to an output terminal 159 of the multiplexer 140, the selected signal being the local clock signal which is applied to a clock input 124 of the flip flop 120.

The apparatus 100 further comprises phase detection means in the form of a phase detector 160. Output terminals 114, 126 of the delay means 110 and the flip flop 120 are connected to input terminals 161-162 of the phase detector 160, and the phase detector 160 is responsive to the delayed data signal and the regenerated data signal when enabled by an enabling signal on an enable terminal 166 to provide on output terminals 164-165 an output condition which is indicative of a difference between the phase of the delayed data signal and the phase of the regenerated data signal. The enabling signal is provided by a control element 170 which is connected to the output terminal 114 of the delay means and which provides an enabling signal at every second 1-0 transition of the delayed data signal.

The apparatus further comprises retarding and advancing means in the form of an up/down counter 180 which has input terminals 181-182 connected to the output terminals 164-165 of the phase detector 160, output terminals 184-192 connected to the select terminals 150-157 of the multiplexer 140, and an enable terminal 194 connected to the control element 170. When enabled by the control means at every second 1-0 transition of the delayed data signal, the up/down counter provides an upward or downward count on its output terminals 184-191 in response to phase indicating signals provided by the phase detector 160.

The apparatus 100 further comprises means for retiming the delayed data signal in the form of another D-type flip flop 195. The flip flop 195 has a D-input 197 connected to the output terminal 114 of the delay means 110 and an inverting clock input terminal 199 connected to the output terminal 159 of the multiplexer 140.

In operation of the apparatus 100, the phase detector 160 compares the phase of the delayed data signal to the phase of the regenerated data signal at every second 1-0 transition of the delayed data signal. If the regenerated data signal leads the delayed data signal, the phase detector 160 applies an output condition to the input terminals 181-182 of the up/down counter 180 which increases the count to cause the multiplexer 140 to select the next tap 131-138 of the tapped delay line, thereby retarding the phase of the local clock signal by one eighth bit period. Conversely, if the regenerated data signal lags the delayed data signal, the phase detector 160 applies an output condition to the input terminals 181-182 of the up/down counter 180 which decreases the count to cause the multiplexer 140 to select the previous tap 131-138 of the tapped delay line 130, thereby advancing the phase of the local clock signal by one eighth bit period.

At every second subsequent 1-0 transition of the delayed data signal, the local clock signal is advanced or retarded as necessary until the phase difference between the delayed data signal and the regenerated data signal is less than one eighth bit period. The local clock signal will then toggle between adjacent phases to maintain a phase difference between the delayed data signal and the regenerated data signal of less than one eighth bit period until a new packet arrives and phase realignment is once again required.

Figure 3:
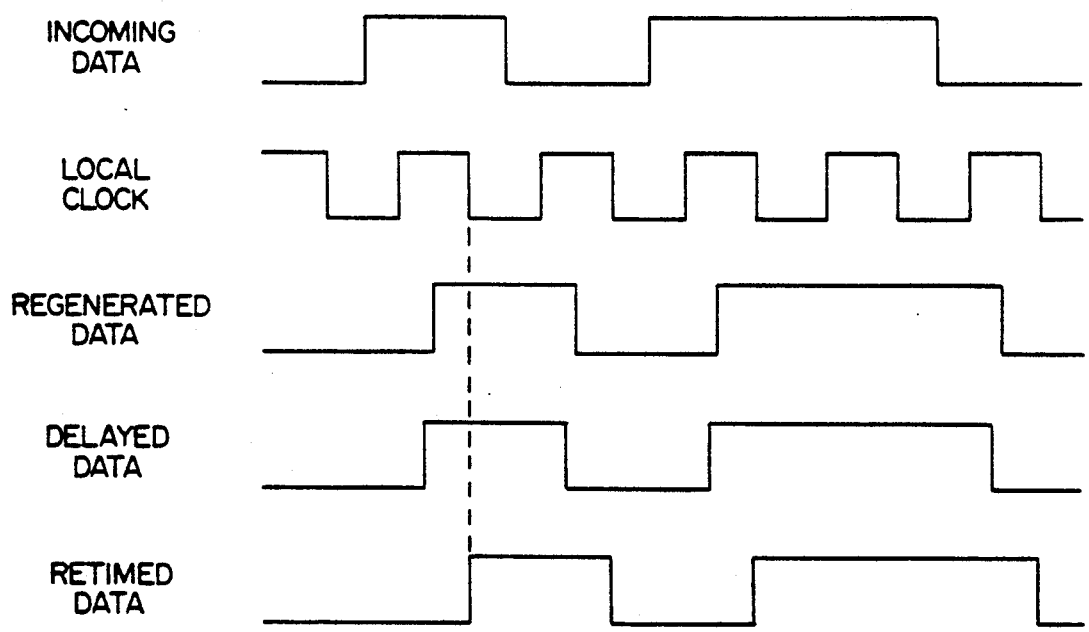
FIG. 3 is a timing diagram showing waveforms at selected nodes of the apparatus of FIG. 1.

The flip flop 195 which is clocked by the inverted local clock signal provides a retimed data signal for which 0-1 transitions of the local clock are centered in the bit period to within one eighth bit period for optimal demultiplexing or other processing of the retimed data signal. The timing relationship between the incoming data signal, the local clock signal, the regenerated data signal, the delayed data signal and the retimed data signal are illustrated in a timing diagram in FIG. 3.

Figure 4:
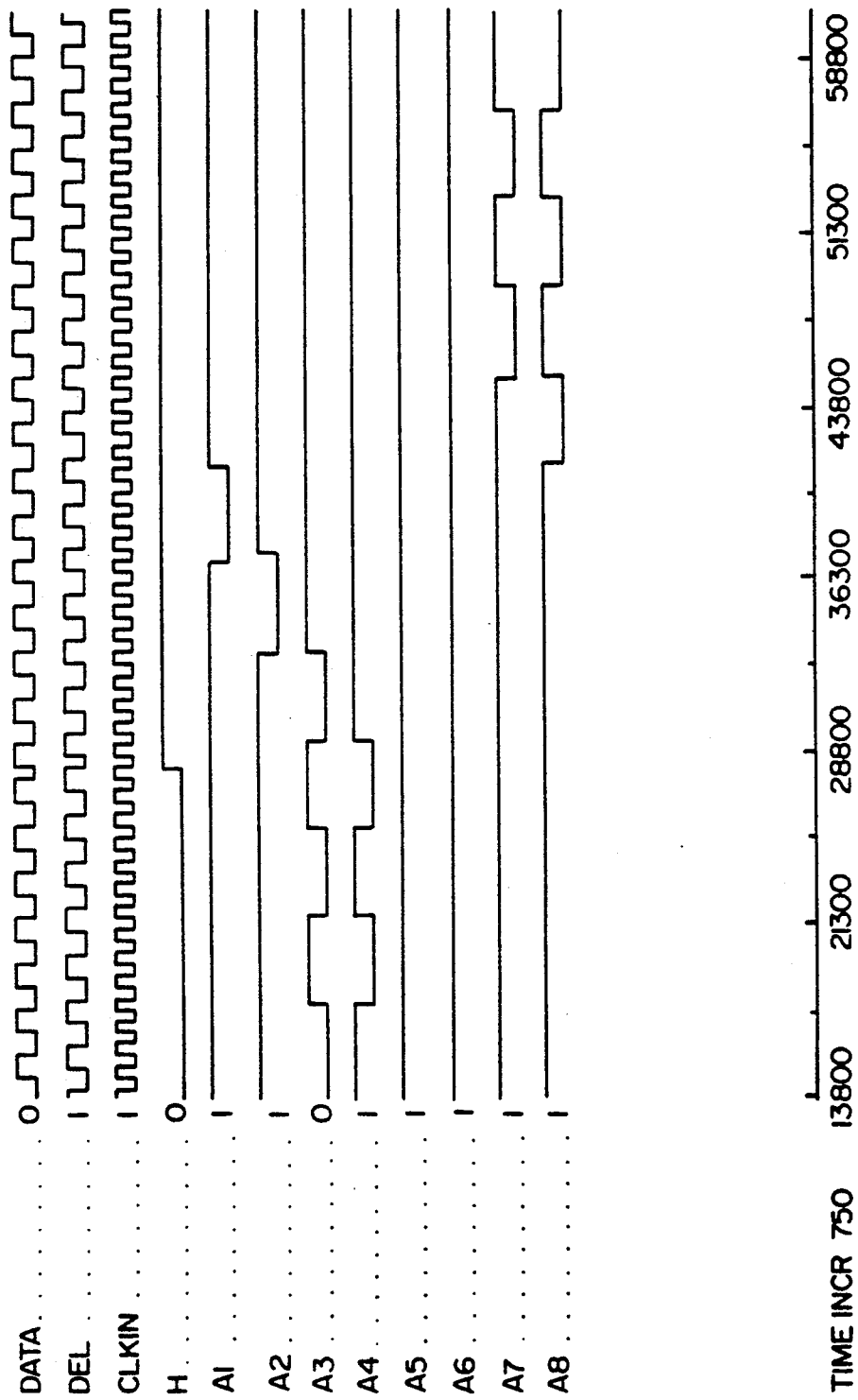
FIG. 4 is a timing diagram from a simulation of the apparatus of FIG. 1, showing the operation of the apparatus of FIG. 1.

The results of a circuit simulation illustrating the operation of the phase alignment apparatus 100 are shown in FIG. 4. The incoming data signal, denoted DATA, is an alternating "1-0" pattern with a 180 degree phase shift induced by the 0-1 transition of the signal denoted H. The delayed data signal is denoted DEL, and the high frequency input clock signal is denoted CLKIN. The signals denoted A1-A8 are decoded outputs of the up/down counter 180 which drive the multiplexer 140. Prior to the 0-1 transition in the signal denoted H, the up/down counter toggles between a state having a 1 in A4 and a state having a 1 in A3 at every second 1-0 transition of the delayed data signal. After the 0-1 transition in the signal denoted H, the up/down counter moves over four bit periods to an operating point between states having a 1 in A7 and a 1 in A8. Eight 1-0 transitions of the delayed data signal are needed to achieve phase alignment, two 1-0 transitions per bit period.

Figure 5:
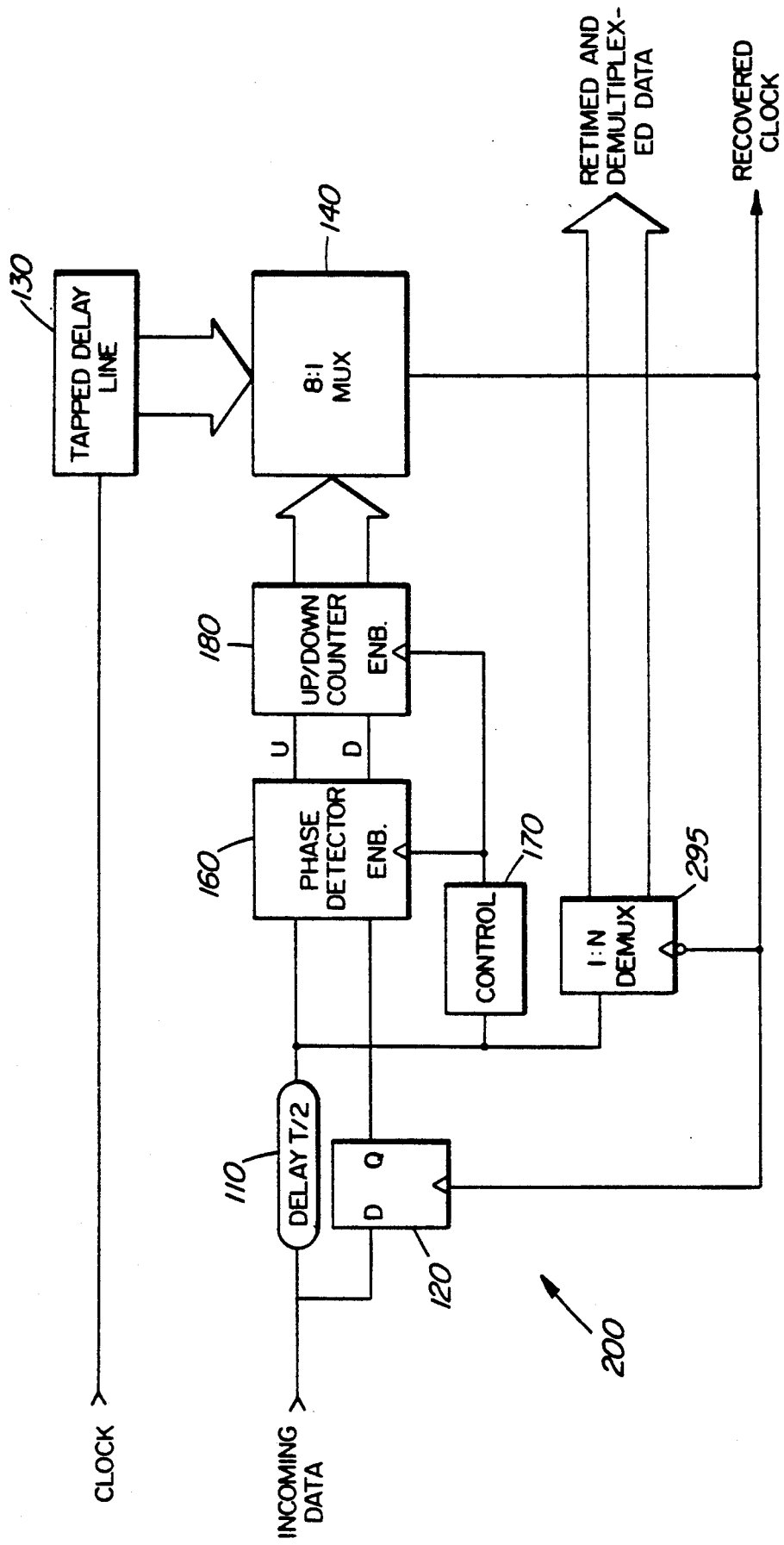
FIG. 5 is a block diagram of apparatus according to a second embodiment of the invention.

The toggling of the local clock signal between adjacent phases will cause high frequency jitter of approximately one eighth bit period in the retimed data signal. FIG. 5 is a block diagram of apparatus 200 according to a second embodiment of the invention which can be used to provide better jitter performance if downstream demultiplexing of the retimed data is required. In the apparatus 200, the demultiplexing function is moved upstream by replacing the retiming flip flop 195 of the apparatus 100 with a 1:N demultiplexer 295. The demultiplexer 295 provides N retimed and demultiplexed signals, each of which has jitter which is reduced by a factor of N compared to the single retimed data signal provided by the flip flop 195 of the apparatus 100. If downstream demultiplexing of the retimed data is not required, jitter in the retimed data can be reduced by more conventional jitter reduction techniques.

The control element 170 is provided to prevent race conditions which could interfere with the proper operation of the apparatus 100, 200 at high frequencies. By limiting phase detection and local clock signal reselection to every second 1-0 transition of the delayed data, time is provided for propagation of the selected local clock signal to the regenerating flip flop 120. The control element 170 may be replaced by a simple inverter if the apparatus 100, 200 is to be operated at frequencies which are low enough to ensure that race conditions will not occur.

The retiming flip flop 195 of the apparatus 100 is provided to provided retimed data which has an optimal phase relationship with the selected local clock even if the delay imposed by the delay means 110 deviates somewhat from one half bit period. If the delay means 110 imposes a delay which is close enough to one half bit period, the retimed data can be taken directly from output terminal 114 of the delay means, and the retiming flip flop 195 can be eliminated.

The up/down counter 180 performs a simple integrating function in the apparatus 100, 200 and could be replaced by digital filters having more complex integrating functions to provide modified operating characteristics.

If phase alignment more accurate than one eighth bit period is required, a tapped delay line providing more than eight taps and a multiplexer having more than eight inputs can be used to provide more closely spaced clock phases. For example, a tapped delay line having sixteen taps could be used with a 16:1 multiplexer to provide phase alignment to within one sixteenth bit period. In this case, however, up to eight 0-1 transitions of the local clock signals would be required to achieve phase alignment.

These and other modifications are within the scope of the invention as claimed below.

We claim:

1. A method for aligning the phase of a local clock signal with the phase of a data signal, the method comprising:

providing a series of clock signals having phases which are uniformly spaced by a predetermined fraction of a bit period by connecting a clock signal to tapped delay means having plural outputs connected to a multiplexer;

providing the local clock signal by selecting one of the clock signals of the series of clock signals by operation of the multiplexer;

delaying an incoming data signal to provide a delayed data signal;

regenerating the incoming data signal with the said local clock signal to provide a regenerated data signal;

on predetermined transitions of the delayed data signal, detecting a difference between the phase of the delayed data signal and the phase of the regenerated data signal with a phase detector which provides a first output condition when the phase of the regenerated data signal leads the phase of the delayed data signal and a second output condition when the phase of the regenerated data signal lags the phase of the delayed data signal;

on predetermined transitions of the delayed data signal, driving selection inputs of the multiplexer with a counter responsive to the first output condition to increase the count and responsive to the second output condition to decrease the count to retard the phase of the local clock signal by the predetermined fraction of a bit period when the regenerated data signal leads the delayed data signal by selecting from the series of clock signals a clock signal which is adjacent to the previously selected clock signal in the series of clock signals and to advance the phase of the local clock signal by the predetermined fraction of a bit period when the regenerated data signal lags the delayed data signal by selecting from the series of clock signals a clock signal which is adjacent to the previously selected clock signal in the series of clock signals;

continuously repeating said regenerating, detecting, retarding and advancing steps to obtain and maintain approximate alignment of the phase of the local clock signal with the phase of the delayed data signal.

2. A method for aligning the phase of a local clock signal with the phase of a data signal, the method comprising:

delaying an incoming data signal to provide a delayed data signal;

regenerating the incoming data signal with the said local clock signal to provide a regenerated data signal;

detecting a difference between the phase of the delayed data signal and the phase of the regenerated data signal;

retarding the phase of the local cock signal by a predetermined fraction of a bit period when the regenerated data signal leads the delayed data signal;

advancing the phase of the local clock signal by the predetermined fraction of a bit period when the regenerated data signal lags the delayed data signal;

continuously repeating said regenerating, detecting, retarding and advancing steps to obtain and maintain approximate alignment of the phase of the local clock signal with the phase of the delayed data signal;

inverting the local clock signal to provide an inverted clock signal; and retiming the delayed data signal with the inverted clock signal to provide a retimed data signal.

3. A method for aligning the phase of a local clock signal with the phase of a data signal, the method comprising:

delaying an incoming data signal to provide a delayed data signal;

regenerating the incoming data signal with the said local clock signal to provide a regenerated data signal;

detecting a difference between the phase of the delayed data signal and the phase of the regenerated data signal;

retarding the phase of the local clock signal by a predetermined fraction of a bit period when the regenerated data signal leads the delayed data signal;

advancing the phase of the local clock signal by the predetermined fraction of a bit period when the regenerated data signal lags the delayed data signal;

continuously repeating said regenerating, detecting, retarding and advancing steps to obtain and maintain approximate alignment of the phase of the local clock signal with the phase of the delayed data signal;

inverting the local clock signal to provide an inverted clock signal; and retiming and demultiplexing the delayed data signal with the inverted clock signal to provide retimed and demultiplexed data signals.

4. Apparatus for aligning the phase of a local clock signal with the phase of a data signal, the apparatus comprising:

delay means for delaying an incoming data signal to provide a delayed data signal;

local clock signal generating means for generating the said local clock signal;

regenerating means responsive to the local clock signal to regenerate the incoming data signal;

phase detection means responsive to the delayed data signal and the regenerated data signal to provide an output condition indicative of a difference between the phase of the delayed data signal and the phase of the regenerated data signal; and retarding and advancing means responsive to the output condition of the phase detection means and operably connected to the local clock generating means to retard the phase of the local clock by a predetermined fraction of a bit period when the regenerated data signal leads the delayed data signal and to advance the phase of the local clock by the predetermined fraction of a bit period when the regenerated data signal lags the delayed data signal; and means for inverting the local clock signal to provide an inverted clock signal and for retiming the delayed data signal with the inverted clock signal to provide a retimed data signal.

5. Apparatus for aligning the phase of a local clock signal with the phase of a data signal, the apparatus comprising:

delay means for delaying an incoming data signal to provide a delayed data signal;

local clock signal generating means for generating the said local clock signal;

regenerating means responsive to the local clock signal to regenerate the incoming data signal;

phase detection means responsive to the delayed data signal and the regenerated data signal to provide an output condition indicative of a difference between the phase of the delayed data signal and the phase of the regenerated data signal; and retarding and advancing means responsive to the output condition of the phase detection means and operably connected to the local clock generating means to retard the phase of the local clock by a predetermined fraction of a bit period when the regenerated data signal leads the delayed data signal and to advance the phase of the local clock by the predetermined fraction of a bit period when the regenerated data signal lags the delayed data signal; and means for inverting the local clock signal to provide an inverted clock signal and for retiming and demultiplexing the delayed data signal with the inverted clock signal to provide retimed and demultiplexed data signals.

6. Apparatus for aligning the phase of a local clock signal with the phase of a data signal, the apparatus comprising:

delay means for delaying an incoming data signal to provide a delayed data signal;

local clock signal generating means for generating the said local clock signal;

regenerating means responsive to the local clock signal to regenerate the incoming data signal;

phase detection means responsive to the delayed data signal and the regenerated data signal to provide an output condition indicative of a difference between the phase of the delayed data signal and the phase of the regenerated data signal; and retarding and advancing means responsive to the output condition of the phase detection means and operably connected to the local clock generating means to retard the phase of the local clock by a predetermined fraction of a bit period when the regenerated data signal leads the delayed data signal and to advance the phase of the local clock by the predetermined fraction of a bit period when the regenerated data signal lags the delayed data signal; and control means responsive to the delayed data signal and operably connected to the phase detection means and the retarding and advancing means for enabling detection of the difference between the phase of the delay data signal and the phase of the regenerated data signal and consequent advancing and retarding of the phase of the local clock signal only on predetermined transitions of the delayed data signal.

* * * * *